United States Patent
Onodera et al.

(10) Patent No.: US 7,964,446 B2
(45) Date of Patent: *Jun. 21, 2011

(54) SEMICONDUCTOR DEVICE AND METHOD OF MANUFACTURING THE SAME

(75) Inventors: Masanori Onodera, Tokyo (JP); Kouichi Meguro, Tokyo (JP)

(73) Assignee: Spansion LLC, Sunnyvale, CA (US)

( * ) Notice: Subject to any disclaimer, the term of this patent is extended or adjusted under 35 U.S.C. 154(b) by 87 days.

This patent is subject to a terminal disclaimer.

(21) Appl. No.: 12/044,851

(22) Filed: Mar. 7, 2008

(65) Prior Publication Data

US 2008/0217792 A1    Sep. 11, 2008

(30) Foreign Application Priority Data

Mar. 7, 2007    (JP) .................. 2007-057828

(51) Int. Cl.
*H01L 21/336* (2006.01)
(52) U.S. Cl. .......... 438/108; 438/614; 257/E21.503
(58) Field of Classification Search .......... 438/108, 438/112, 127, 613, 614
See application file for complete search history.

(56) References Cited

U.S. PATENT DOCUMENTS

| | | | |
|---|---|---|---|
| 6,590,287 B2 * | 7/2003 | Ohuchi | 257/738 |
| 2003/0096495 A1 * | 5/2003 | Ihara et al. | 438/614 |
| 2005/0218451 A1 * | 10/2005 | Jobetto | 257/347 |
| 2006/0084258 A1 * | 4/2006 | Nemoto et al. | 438/611 |

OTHER PUBLICATIONS

"Base." Merriam-Webster Online Dictionary. Jun. 30, 2010. <http://www.merriam-webster.com/dictionary/base>.*

* cited by examiner

*Primary Examiner* — Charles D Garber
*Assistant Examiner* — Reema Patel

(57) ABSTRACT

A manufacturing method of a semiconductor device includes: forming a columnar electrode on a semiconductor wafer; flip-chip bonding a second semiconductor chip onto the semiconductor wafer; forming a molding portion on the semiconductor wafer, the molding portion covering and molding the columnar electrode and the second semiconductor chip; grinding or polishing the molding portion and the second semiconductor chip so that an upper face of the columnar electrode and an upper face of the semiconductor chip are exposed; and cutting the molding portion and the semiconductor wafer so that a first semiconductor chip, where the second semiconductor chip is flip-chip bonded and the columnar electrode is formed, is formed.

11 Claims, 12 Drawing Sheets

SEMICONDUCTOR DEVICE AND METHOD OF MANUFACTURING THE SAME

CROSS-REFERENCE TO RELATED APPLICATIONS

The present invention is based on Japanese Patent Application No. 2007-057828 filed on Mar. 7, 2007, the entire disclosure of which is hereby incorporated by reference.

TECHNICAL FIELD

This invention generally relates a semiconductor device and a method of manufacturing the semiconductor device, and in particular, relates a semiconductor device, in which a second semiconductor chip is flip-chip bonded onto a first semiconductor chip, and a method of manufacturing the semiconductor device.

BACKGROUND OF THE INVENTION

There is developed a semiconductor device in which semiconductor chips are stacked for a purpose of reducing a package density. A CoC (Chip on Chip) technology, in which a semiconductor chip is flip-chip bonded onto another semiconductor chip, is used for the purpose of reducing the package density. The flip-chip-bonding is hereinafter referred to as FCB. Au (gold), Cu (copper), solder or the like is used as a bump for the FCB.

FIG. 1 illustrates a cross sectional view of a semiconductor device in accordance with a first conventional embodiment. A first semiconductor chip 11 is face-up mounted on an intermediate substrate 50 through a die attach member 88. A wiring 12 is provided on the first semiconductor chip 11. A second semiconductor chip 20 is flip-chip bonded onto a pad 12a of the wiring 12 through a bump 14. A first resin member 86 acting as an under fill member is formed between a bottom face of the second semiconductor chip 20 (a face on which a circuit is formed) and an upper face of the first semiconductor chip 11 (a face on which a circuit is formed). The first semiconductor chip 11 and the second semiconductor chip 20 are sealed with a second resin portion 80. A wiring 52 for a redistribution pattern or a flip-chip pad is provided on an upper face of the intermediate substrate 50. A wiring 54 for a land electrode is provided on a bottom face of the intermediate substrate 50. The wiring 52 and the wiring 54 are electrically coupled to each other with a coupling portion 56. A solder ball 58 is formed on the wiring 54. The first semiconductor chip 11 and the wiring 52 of the intermediate substrate 50 are electrically coupled to each other through a bonding wire 82.

FIG. 2 illustrates a cross sectional view of a semiconductor device in accordance with a second conventional embodiment. The first semiconductor chip 11 is flip-chip bonded onto the intermediate substrate 50 through bump 84. The second semiconductor chip 20 is face-up mounted on the first semiconductor chip through the die attach member 88. An upper face of the second semiconductor chip 20 is electrically coupled to the wiring 52 of the intermediate substrate 50 through the bonding wire 82. Other structure is the same as that of the first conventional embodiment. And an explanation is omitted.

Japanese Patent Application Publication No. 2000-156461 (hereinafter referred to as Document 1) discloses a third conventional embodiment where a semiconductor chip and a solder ball interposer are flip-chip bonded onto a semiconductor wafer, a resin is coated, and the resin is grinded.

In the first conventional embodiment and the second conventional embodiment, a packaging density is reduced because the first semiconductor chip 11 and the second semiconductor chip 20 are stacked. However, either the first semiconductor chip 11 or the second semiconductor chip 20 is flip-chip bonded. There is a problem that it is difficult to reduce a thickness of a semiconductor chip to be flip-chip bonded to less than 100 μm. This is because it is difficult to handle a thin semiconductor chip from a wafer or a chip tray when the semiconductor chip is flip-chip bonded. And this is because handling is difficult, an under fill member reaches an upper face of the semiconductor chip having a small thickness, and the under fill member is adhered to a bonding tool for handling the semiconductor chip, when the flip-chip bonding is preformed with Au—Au compression method. It is difficult to reduce the thickness of the semiconductor chip in the first conventional embodiment and the second conventional embodiment where the semiconductor chip is flip-chip bonded.

In FIG. 12 in Document 1, thickness of a semiconductor chip 130 is not reduced, although a coated layer is grinded. And it is difficult to reduce the thickness of the semiconductor device.

An under fill member is provided in order to restrain an electrical short caused by a foreign material or the like, when the semiconductor chip is flip-chip bonded. However, a manufacturing cost is increased because the under fill member is provided in each of the semiconductor chips.

SUMMARY OF THE INVENTION

The present invention provides a semiconductor device that may have a reduced height or have an under fill member formed easily and a manufacturing method of the same According to an aspect of the present invention, preferably, there is provided a manufacturing method of a semiconductor device including: forming a columnar electrode on a semiconductor wafer; flip-chip bonding a second semiconductor chip onto the semiconductor wafer; forming a molding portion on the semiconductor wafer, the molding portion covering and molding the columnar electrode and the second semiconductor chip; grinding or polishing the molding portion and the second semiconductor chip so that an upper face of the columnar electrode and an upper face of the semiconductor chip are exposed; and cutting the molding portion and the semiconductor wafer so that a first semiconductor chip, where the second semiconductor chip is flip-chip bonded and the columnar electrode is formed, is formed. With the method, the height of the semiconductor device may be reduced, because the second semiconductor chip is grinded or polished together with the molding portion. And a stress caused by a thermal expansion coefficient difference is restrained, because the semiconductor device is composed of the first semiconductor chip and the second semiconductor chip.

The method may further include comprising grinding or polishing a lower face of the semiconductor wafer. With the method, the height of the semiconductor device may be further reduced.

The columnar electrode may be electrically coupled to the first semiconductor chip and the second semiconductor chip. With the method, a packaging density of the semiconductor device may be improved, because the upper face of the molding portion is electrically coupled to the first semiconductor chip and the second semiconductor chip.

The step of forming the columnar electrode may be a step of forming the columnar electrode with an electrolytic plating method. With the method, the columnar electrode may be formed easily.

The step of forming the columnar electrode may include forming a lower electrode and a barrier electrode on the semiconductor wafer with a plating method. And the step of grinding or polishing the molding portion may include grinding or polishing the molding portion together with an upper portion of the barrier electrode. With the method, the barrier electrode may have an adequate thickness.

The method may include forming a solder terminal on the barrier electrode.

The step of flip-chip bonding of the second semiconductor chip may be performed after the step of forming the columnar electrode. With the method, it is possible to remove a seed metal for electrolytic plating.

The step of forming the columnar electrode may be a step of forming the columnar electrode so as to be lower than the second semiconductor chip that is to be flip-chip bonded onto the semiconductor wafer. With the method, a contact of the semiconductor chip may be restrained during the flip-chip bonding. And, processes of forming the columnar electrode may be reduced.

The step of forming the molding portion may include a step of forming a first resin portion so as to cover between an upper face of the semiconductor wafer and a lower face of the second semiconductor chip and a step of forming a second resin portion on the first resin portion. With the method, the second resin portion may have little influence on reliability of the first semiconductor chip and the second semiconductor chip. It is therefore possible to select a material of the second resin portion flexibly.

The step of forming the first resin portion may include a step of coating a liquid resin to be the first resin portion, on the semiconductor wafer. With the method, it is not necessary to fill the resin under each of the second semiconductor chip on the semiconductor wafer. It is therefore possible to reduce the manufacturing cost of the semiconductor device.

The method may further include mounting the first semiconductor chip onto a mount portion. With the method, it is possible to reduce the height of the semiconductor device having an intermediate substrate where a plurality of semiconductor chips are mounted.

According to an aspect of the present invention, preferably, there is provided a semiconductor device including: a first semiconductor chip; a second semiconductor chip that is flip-chip bonded onto the first semiconductor chip; a columnar electrode that is provided on the first semiconductor chip and is electrically coupled to the first semiconductor chip; and a molding portion having a first resin portion and a second resin portion, the first resin portion covering between an upper face of the first semiconductor chip and a lower face of the second semiconductor chip and being provided on whole of the first semiconductor chip, the second resin portion being provided on the first resin portion and molding the columnar electrode and the second semiconductor chip so that an upper face of the columnar electrode and an upper face of the second semiconductor chip are exposed. With the structure, the first resin portion is provided in a region between an upper face of the first semiconductor chip and a lower face of the second semiconductor chip, the region having a most influence on reliability. It is therefore possible to select the material of the second resin portion flexibly.

A lower face and a side face of the first semiconductor chip may be exposed from the molding portion.

The semiconductor device may further include a mount portion where the first semiconductor chip is mounted. With the structure, it is possible to reduce the height of the semiconductor device having an intermediate substrate where a plurality of the semiconductor chips are mounted.

DETAILED DESCRIPTION

A description will now be given of best modes for carrying out the present invention.

First Embodiment

Figure 1:
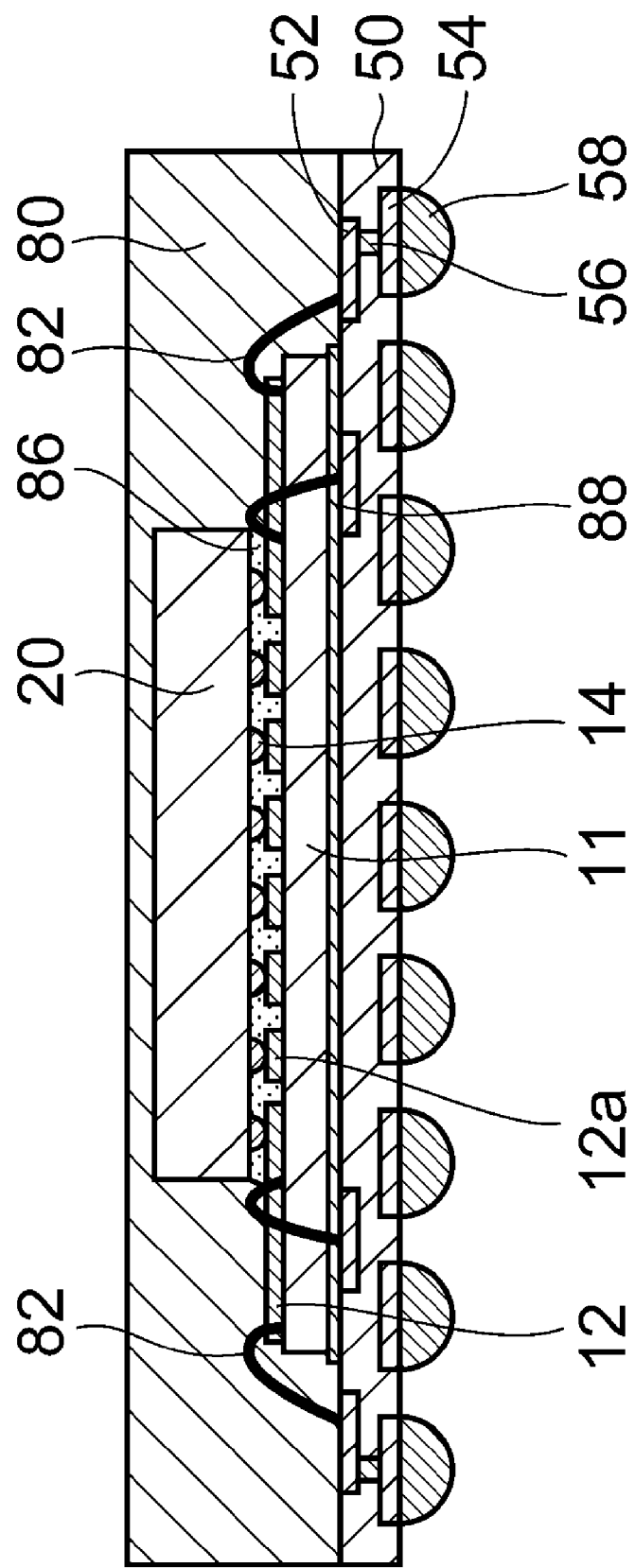
FIG. 1 illustrates a cross sectional view of a semiconductor device in accordance with a first conventional embodiment.
Figure 2:
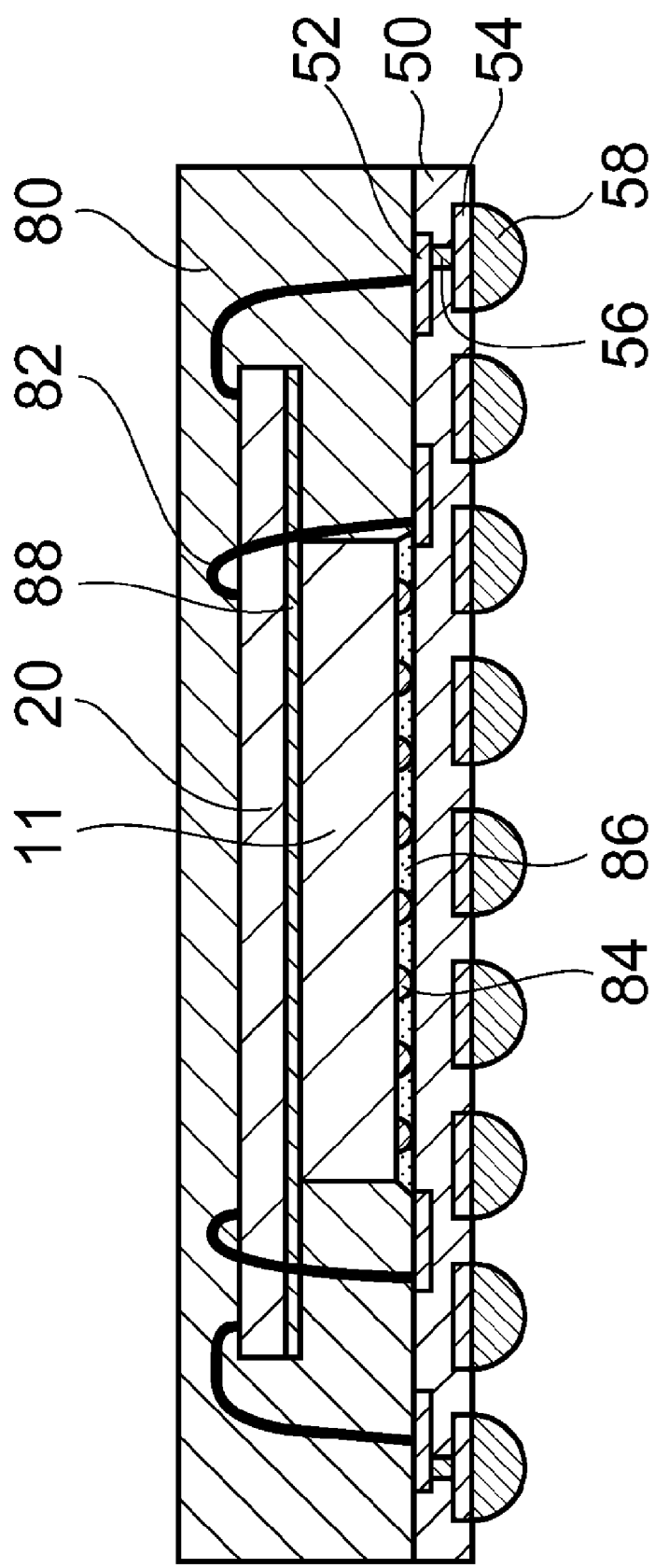
FIG. 2 illustrates a cross sectional view of a semiconductor device in accordance with a second conventional embodiment.
Figure 3A:
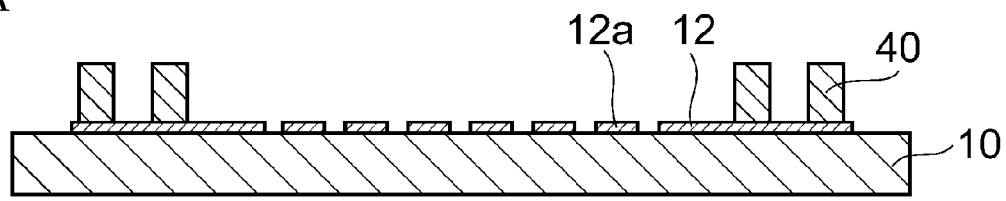
FIG. 3A through FIG. 3D illustrate a manufacturing method of a semiconductor device in accordance with a first embodiment.

A description will be given of a manufacturing method of a semiconductor device in accordance with a first embodiment, with reference to FIG. 3A through FIG. 4C. As shown in FIG. 3A, the wiring 12 made of copper or the like is formed on a semiconductor wafer 10 having a circuit formed on an upper face thereof. The wiring 12 has the pad 12a and a redistribution layer. A second semiconductor chip is flip-chip bonded onto the pad 12a. The redistribution layer re-wires an input-output terminal of the circuit of the semiconductor wafer 10. A columnar electrode 40 made of copper is formed on the wiring 12.

Figure 3B:
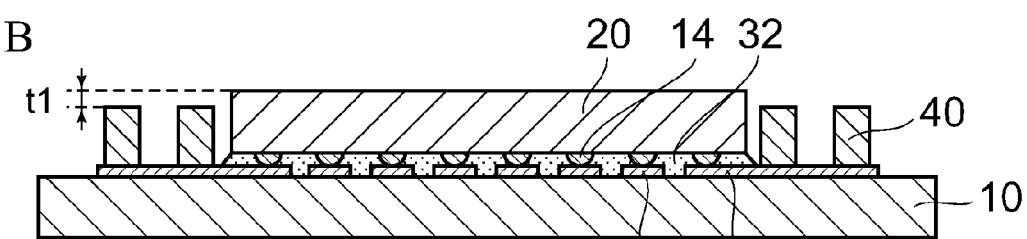

As shown in FIG. 3B, the second semiconductor chip 20 is flip-chip bonded onto the pad 12a of the semiconductor wafer 10 through the bump 14. In this case, a face of the second semiconductor chip 20 where a circuit is formed is a lower face. A position of an upper face of the second semiconductor chip 20 is higher than that of an upper face of the columnar electrode 40. A first resin portion 32 acts as an under fill member, is made of a thermoset epoxy resin, and is formed between an upper face of the semiconductor wafer 10 and a lower face of the second semiconductor chip 20. An interval t3 is, for example, 30 μm between the semiconductor wafer 10 and the second semiconductor chip 20.

Figure 3C:
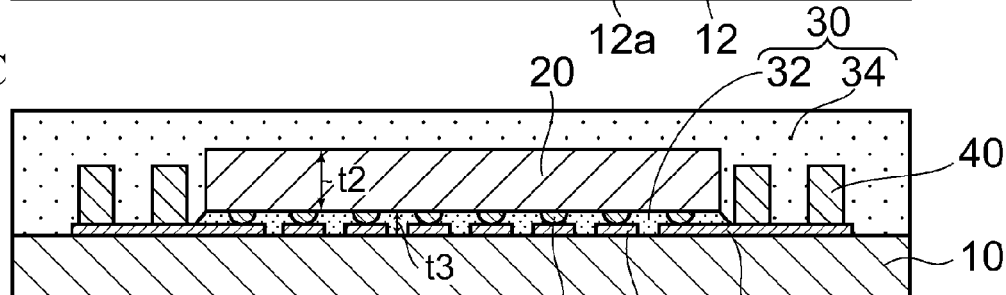
Figure 3D:
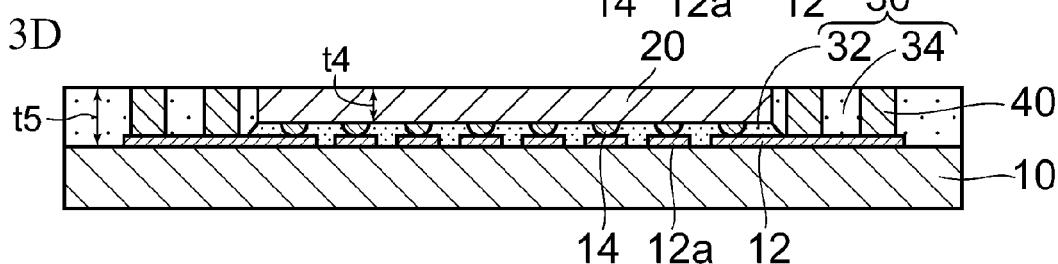

As shown in FIG. 3C, a second resin portion 34 is made of a thermoset epoxy resin and is formed on the semiconductor wafer 10 so as to cover the second semiconductor chip 20 and the columnar electrode 40. Thus, the second semiconductor chip 20 and the columnar electrode 40 are sealed. The first resin portion 32 and the second resin portion 34 form a molding portion 30. As shown in FIG. 3D, the molding portion 30 and the second semiconductor chip 20 are grinded so that an upper face of the second semiconductor chip 20 and an upper face of the columnar electrode 40 are exposed. For example, the second semiconductor chip 20 has a thickness t2 of 750 μm, in FIG. 3C. The second semiconductor chip 20 may have a thickness t4 of 50 μm, in FIG. 3D. The columnar electrode 40 has a height t5 of approximately 80 μm.

Figure 4A:
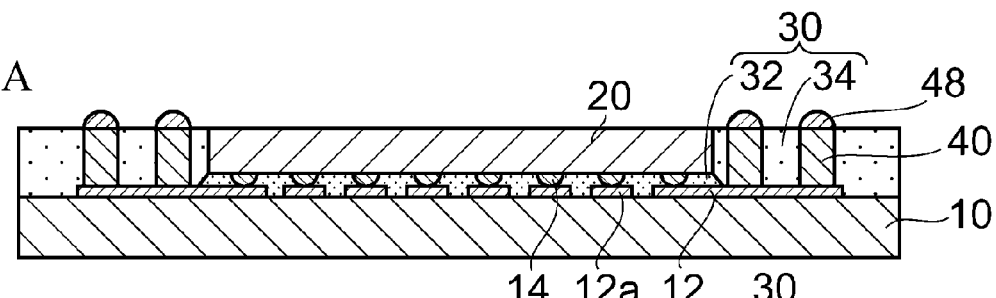
FIG. 4A through FIG. 4C illustrate the manufacturing method of the semiconductor device in accordance with the first embodiment.
Figure 4B:
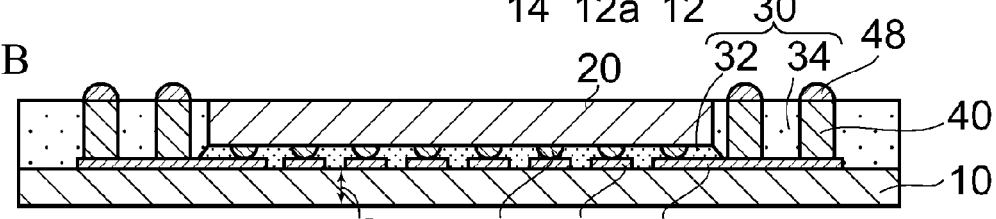
Figure 4C:
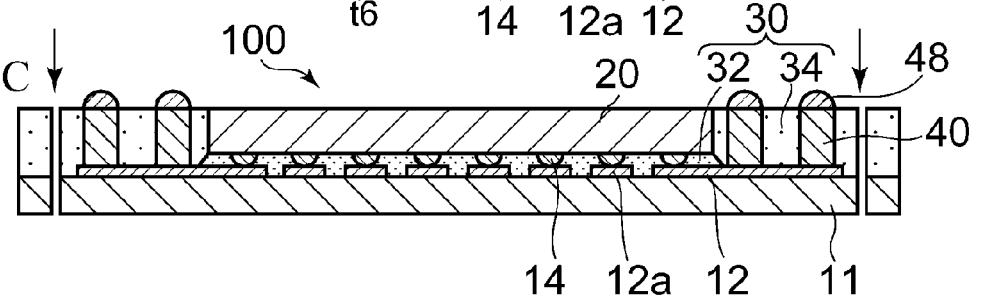

As shown in FIG. 4A, a solder terminal 48 is formed on the columnar electrode 40. As shown in FIG. 4B, a back face of the semiconductor wafer 10 is grinded until a thickness t6 of the semiconductor wafer 10 is reduced to 50 μm to 75 μm. As shown in FIG. 4C, the molding portion 30 and the semiconductor wafer 10 are cut off with a dicing method. Thus, the second semiconductor chip 20 is flip-chip bonded. And the first semiconductor chip 11 having the columnar electrode 40 is formed. With the processes, a semiconductor device 100 in accordance with the first embodiment is fabricated.

Figure 5:
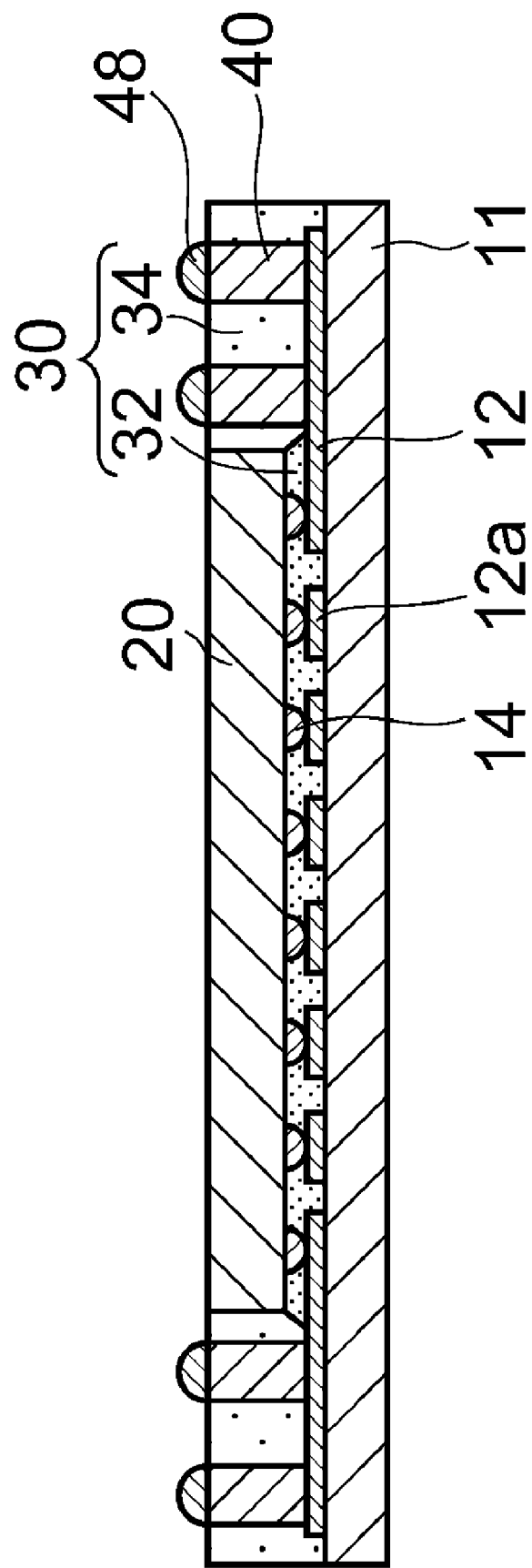
FIG. 5 illustrates a cross sectional view of the semiconductor device in accordance with the first embodiment.

As shown in FIG. 5, the semiconductor device 100 in accordance with the first embodiment that is manufactured with the processes has the first semiconductor chip 11 and the second semiconductor chip 20 flip-chip bonded onto the first semiconductor chip 11. The columnar electrode 40 is provided on the first semiconductor chip 11 and is electrically coupled to the first semiconductor chip 11. The molding portion 30 is provided on the first semiconductor chip 11, and seals the columnar electrode 40 and the second semiconductor chip 20 so that the upper face of the columnar electrode 40 and the upper face of the second semiconductor chip 20 are exposed. The lower face and the side face of the first semiconductor chip 11 are exposed from the molding portion 30.

In accordance with the first embodiment, the second semiconductor chip 20 is grinded together with the molding portion 30, as shown in FIG. 3D. These result in reduction of the thickness of the second semiconductor chip 20 to 30 μm to 100 μm, for example. It is therefore possible to reduce the height of the semiconductor device 100, compared to the first conventional embodiment through the third conventional embodiment. And, exposure of the columnar electrode 40 from the molding portion 30 allows an electrical connection between the upper face of the columnar electrode 40, the first semiconductor chip 11 and the second semiconductor chip 20. It is therefore possible to further reduce the height of the semiconductor device 100. A stress caused by a thermal expansion coefficient difference is restrained, because the semiconductor device 100 is composed of the first semiconductor chip 11 and the second semiconductor chip 20 that are made of the same material (for example, silicon or the like). And a manufacturing cost of the semiconductor device 100 is reduced because the intermediate substrate 50 shown in the first conventional embodiment and the second conventional embodiment is not used in the first embodiment.

Figure 10A:
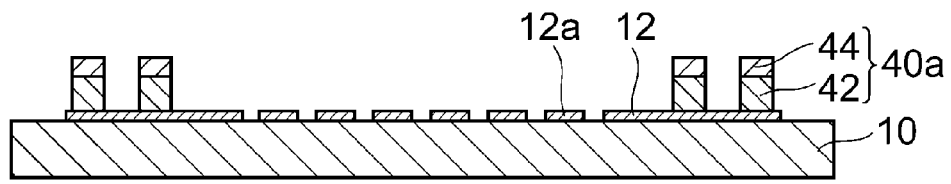
FIG. 10A through FIG. 10D illustrate a manufacturing method of a semiconductor device in accordance with a fourth embodiment.
Figure 10B:
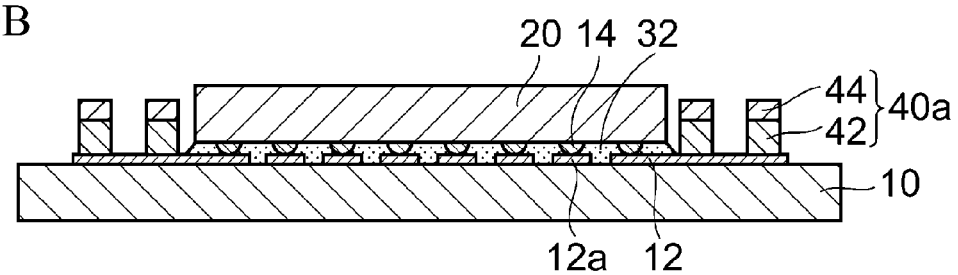
Figure 10C:
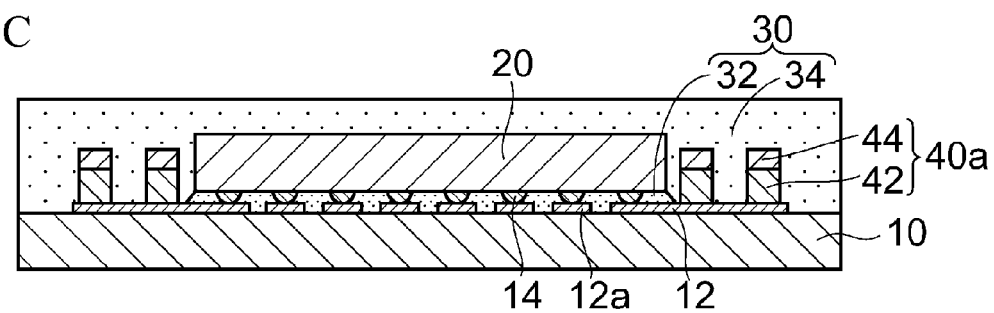
Figure 10D:
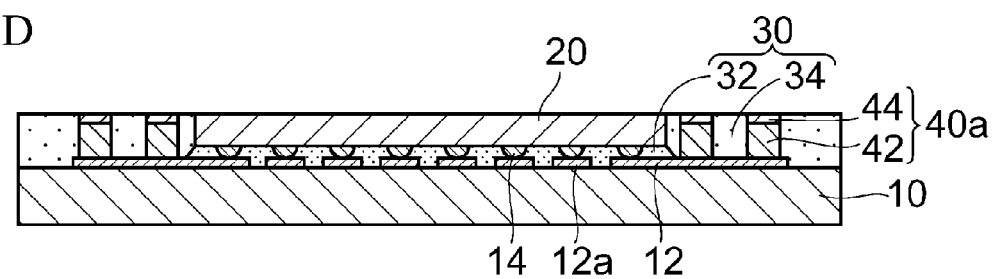
Figure 11:
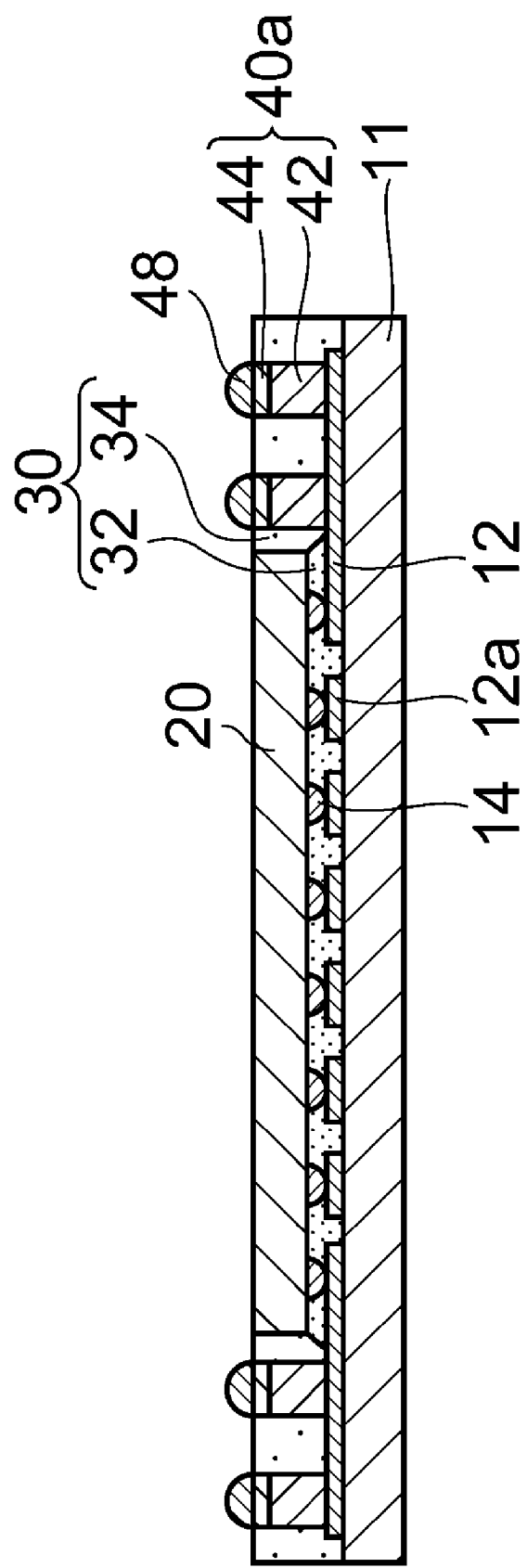
FIG. 11 illustrates a cross sectional view of the semiconductor device in accordance with the fourth embodiment.
Figure 12:
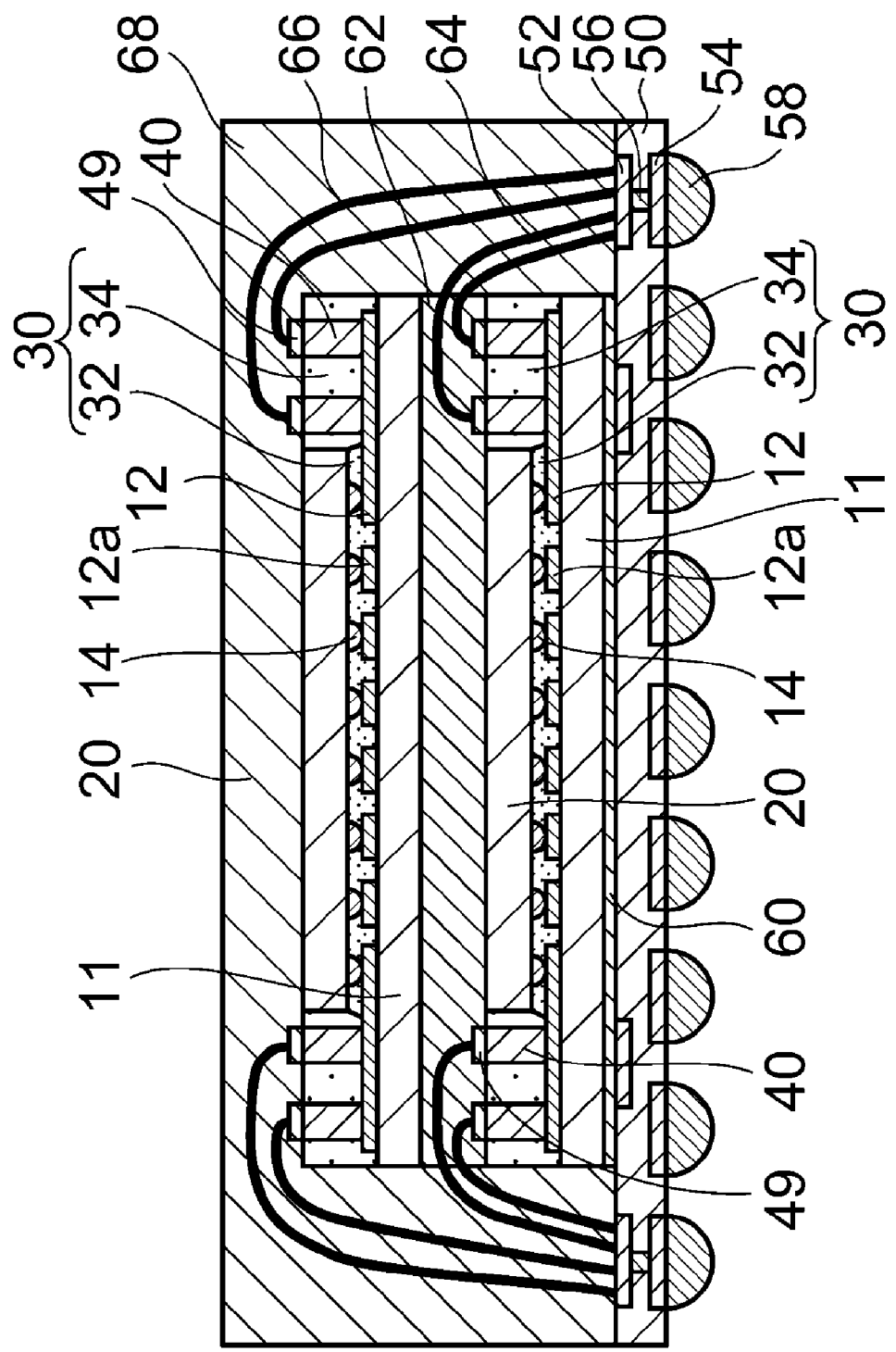
FIG. 12 illustrates a cross sectional view of a semiconductor device in accordance with a fifth embodiment.

And the height of the semiconductor device 100 may be further reduced when the lower face of the semiconductor wafer 10 is grinded as shown in FIG. 4B. The columnar electrode 40 may be formed easily compared to a case where a solder ball interposer is used as shown in FIG. 10 through FIG. 12 disclosed in Document 1, if the columnar electrode 40 is formed with an electrolytic plating method as shown in FIG. 3A. The columnar electrode 40 may be formed with a method other than the plating method.

Figure 6A:
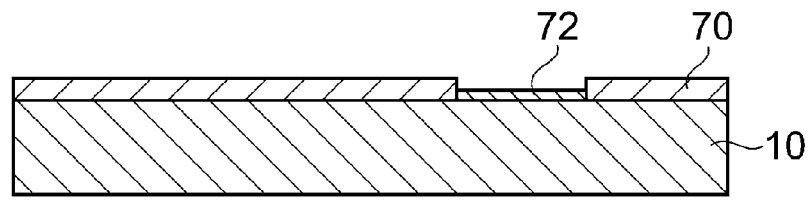
FIG. 6A through FIG. 6E illustrate a manufacturing method of the semiconductor device in accordance with the first embodiment.
Figure 6B:
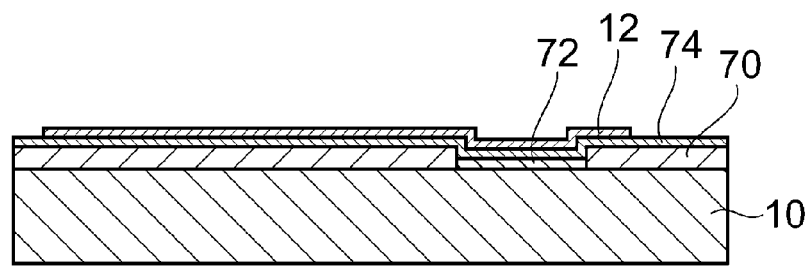

FIG. 6A through FIG. 6E illustrate a schematic cross sectional view showing a method of forming the columnar electrode 40 on the semiconductor wafer 10. The figures illustrate one of electrodes 72 and one of the columnar electrodes 40 on the semiconductor wafer 10. As shown in FIG. 6A, the electrode 72 is formed in an opening of a protective film 70 of the semiconductor wafer 10. The electrode 72 is electrically coupled to a circuit (not shown) formed on the upper face of the semiconductor wafer 10. As shown in FIG. 6B, a seed metal 74 is formed on the protective film 70 on whole of the semiconductor wafer 10. The wiring 12 is formed on the seed metal 74. A pattern of the redistribution layer or the pad 12a (not shown) is provided on the wiring 12.

Figure 6C:
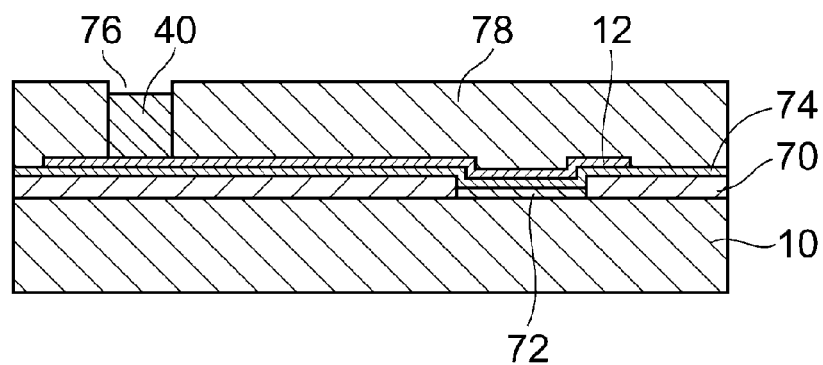
Figure 6D:
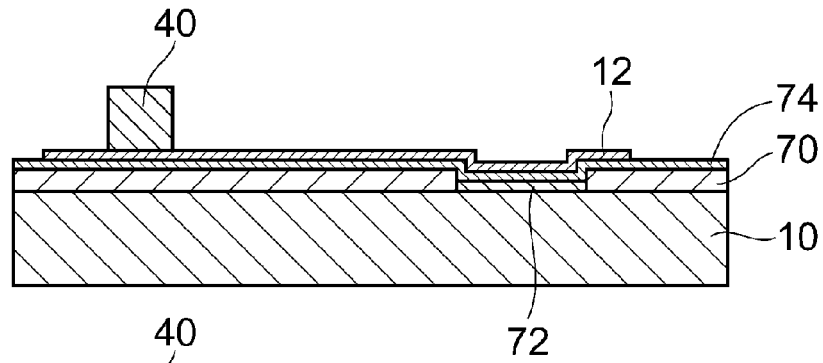
Figure 6E:
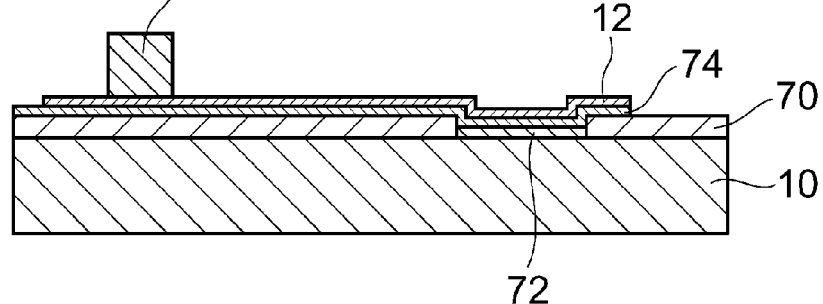

As shown in FIG. 6C, there is formed a photo resist 78 having an opening 76 on the wiring 12. A current is provided through the seed metal 74. And the columnar electrode 40 made of copper is electrolytic plated in the opening 76. As shown in FIG. 6D, the photo resist 78 is removed. As shown in FIG. 6E, the seed metal 74 is etched with use of the wiring 12 as a mask. Thus, the seed metal 74 has the same pattern as the wiring 12. In FIG. 3A through FIG. 4C, the seed metal 74 and the protective film 70 are not shown.

Electrolytic plating having a high coating speed is preferable for a formation of an electrode like the columnar electrode 40 having a large thickness. The current is provided through the seed metal 74, in order to perform the electrolytic plating as shown in FIG. 6A through FIG. 6D, and the columnar electrode 40 is formed. Therefore, the seed metal 74 under the second semiconductor chip 20 may not be etched, if the second semiconductor chip 20 is flip-chip bonded before the formation of the columnar electrode 40. It is therefore preferable that the second semiconductor chip 20 is flip-chip bonded after the formation of the columnar electrode 40.

The second semiconductor chip 20 is vacuum adsorbed with use of a bonding tool and is flip-chip bonded. The second semiconductor chip 20 and the bonding tool may be in touch with the columnar electrode 40 when the bonding tool where the second semiconductor chip 20 is adsorbed is brought down, if the columnar electrode 40 having large height is around an area where the second semiconductor chip 20 is to be flip-chip bonded. And so, it is preferable that the columnar electrode 40 is formed so as to be lower than the second semiconductor chip 20 that is to be flip-chip bonded onto the semiconductor wafer 10 as shown in FIG. 3B, when the columnar electrode 40 is formed as shown in FIG. 3A. This results in a restraint of the contact between the columnar electrode 40 and the second semiconductor chip 20 or the bonding tool. The upper face of the columnar electrode 40 is exposed at the last, when the molding portion 30 and the second semiconductor chip 20 are grinded in the process shown in FIG. 3D. The columnar electrode 40 is formed so as to be lower than the second semiconductor chip 20. This results in reduction of manufacturing processes of formation of the columnar electrode 40.

Second Embodiment

Figure 7A:
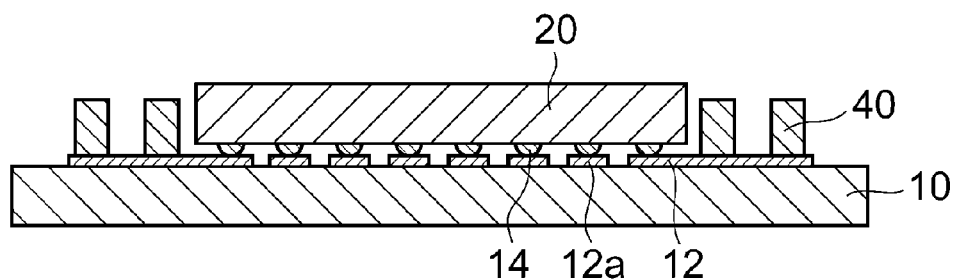
FIG. 7A through FIG. 7C illustrate a manufacturing method of a semiconductor device in accordance with a second embodiment.
Figure 7B:
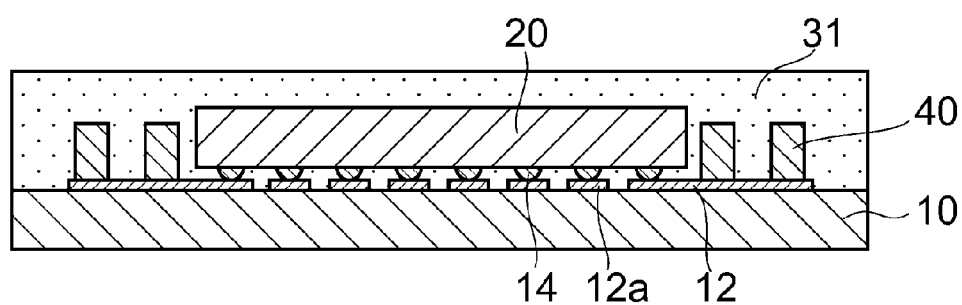
Figure 7C:
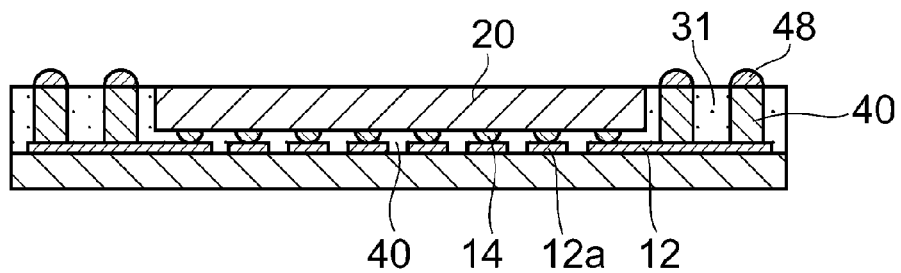

A second embodiment is a case where an under fill member acts as a molding portion. FIG. 7A through FIG. 7C illustrate a cross sectional view showing a manufacturing process of a semiconductor device in accordance with the second embodiment. As shown in FIG. 7A, the second semiconductor chip 20 is flip-chip bonded onto the semiconductor wafer 10 having the columnar electrode 40 as shown in FIG. 3B in the first embodiment. As shown in FIG. 7B, a low-viscosity epoxy resin is spin-coated on the semiconductor wafer 10 so as to be filled between the upper face of the semiconductor wafer 10 and the lower face of the second semiconductor chip 20. And a molding portion 31 is formed with a thermal treatment at 175 degrees C. As shown in FIG. 7C, the semiconductor device in accordance with the second embodiment is fabricated with the processes shown in FIG. 3D through FIG. 4C in the first embodiment.

In accordance with the second embodiment, it is not necessary to fill the resin under each of the second semiconductor chips 20 on the semiconductor wafer 10 respectively as shown in FIG. 3B in the first embodiment, because the epoxy resin is spin-coated on the semiconductor wafer 10. The manufacturing cost is therefore reduced. It is preferable that the low-viscosity resin is a liquid resin including no filler. In this case, it is possible to easily fill the resin between the semiconductor wafer 10 and the second semiconductor chip 20 with the spin coating.

Third Embodiment

Figure 8A:
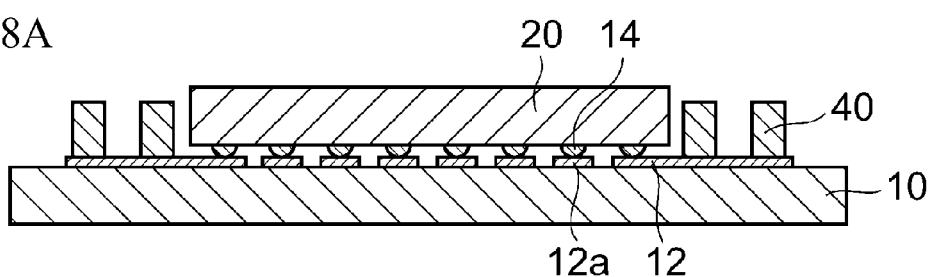
FIG. 8A through FIG. 8C illustrate a manufacturing method of a semiconductor device in accordance with a third embodiment.
Figure 8B:
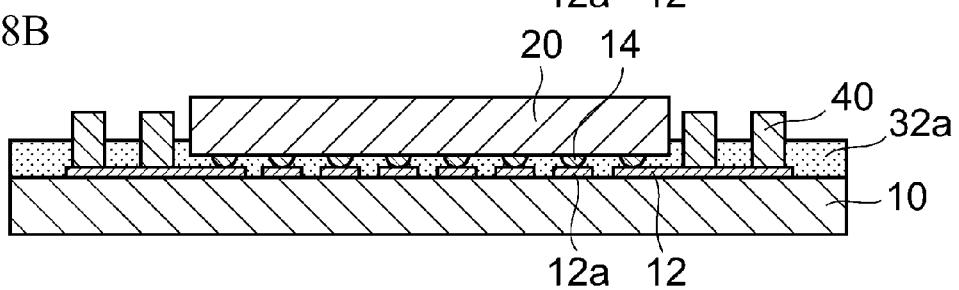
Figure 8C:
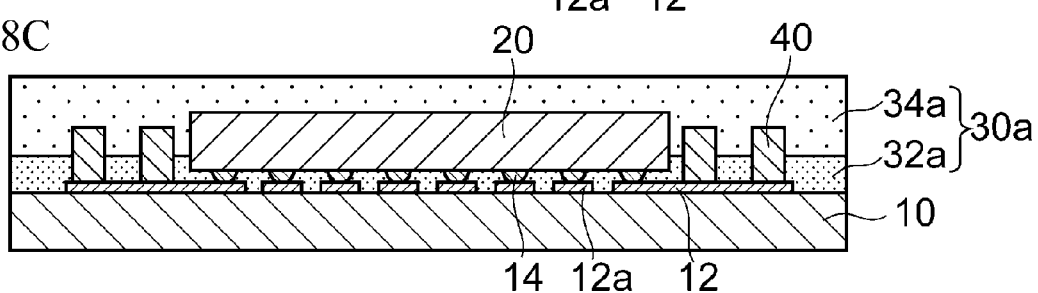
Figure 9:
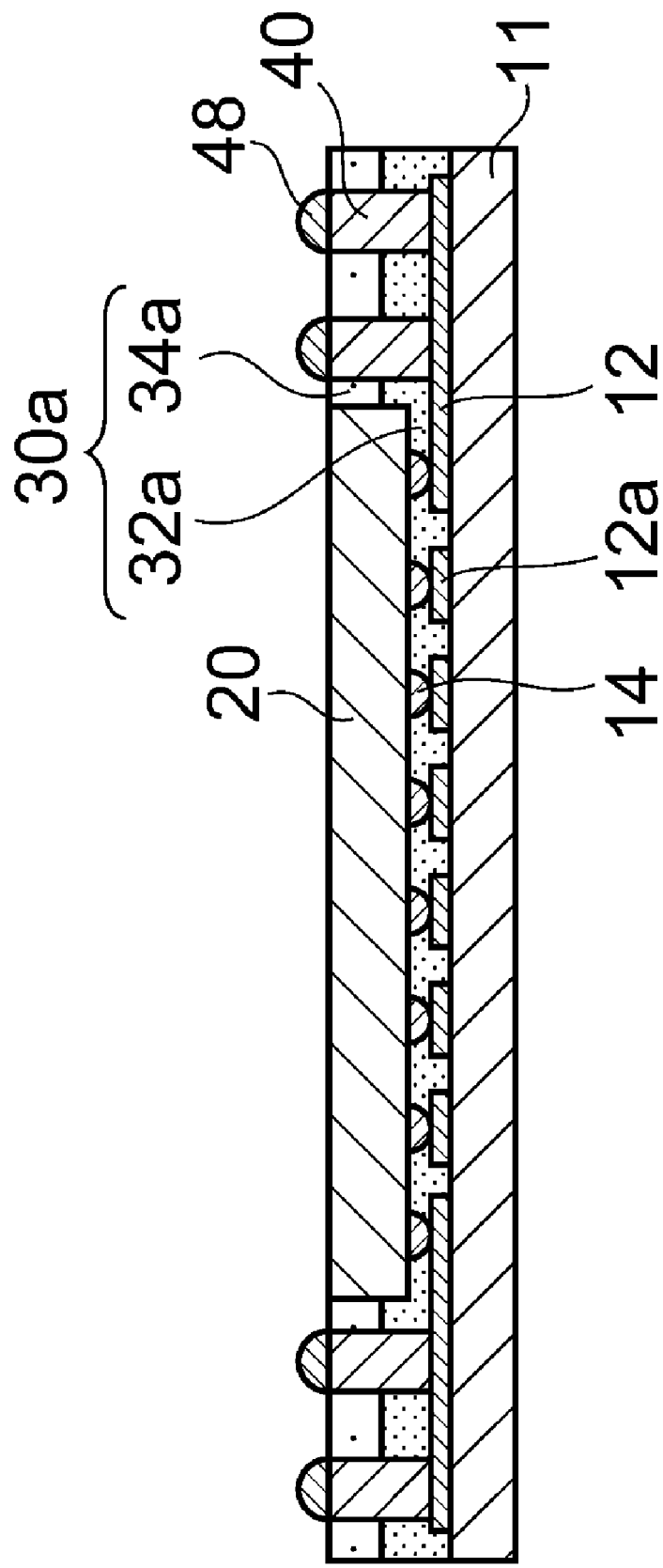
FIG. 9 illustrates a cross sectional view of a semiconductor device in accordance with the third embodiment.

A third embodiment is a case where a molding portion is composed of two resin layers. FIG. 8A through FIG. 8C illustrate a cross sectional view showing a manufacturing process of a semiconductor device in accordance with the third embodiment. As shown in FIG. 8A, the second semiconductor chip 20 is flip-chip bonded onto the semiconductor wafer 10 having the columnar electrode 40 as shown in FIG. 3B in the first embodiment. As shown in FIG. 8B, a low-viscosity epoxy resin is spin-coated on the semiconductor wafer 10 so as to cover the upper face of the semiconductor wafer 10 and the lower face of the second semiconductor chip 20, and a first resin portion 32a is formed. As shown in FIG. 8C, a second resin portion 34a is formed on the first resin portion 32a so as to cover the second semiconductor chip 20 and the columnar electrode 40. The first resin portion 32a and the second resin portion 34a form a molding portion 30a. The semiconductor device in accordance with the third embodiment is fabricated with the processes shown in FIG. 3D through FIG. 4C in the first embodiment.

In accordance with the third embodiment, the first resin portion 32a is formed between the upper face of the first semiconductor chip 11 and the lower face of the second semiconductor chip 20 and above whole of the first semiconductor chip 11. The second resin portion 34a is formed on the first resin portion 32a so that the upper face of the columnar electrode 40 and the upper face of the second semiconductor chip 20 are exposed. Thus, the first resin portion 32a forms the face of the first semiconductor chip 11 and the second semiconductor chip 20 where a circuit is formed. In this case, the first resin portion 32a mostly occupies the resin determining a reliability of the semiconductor device. Thus, the first resin portion 32a acts as an under fill member. On the other hand, the second resin portion 34a has a little influence on the reliability. In the second embodiment, the molding portion 30 is composed of a single material. In contrast, it is therefore possible to select a material of the second resin portion 34a flexibly in the third embodiment. It is, for example, possible to reduce the manufacturing cost when an inexpensive material is used. And it is possible to form the molding portion 30a having a high hardness when a resin including filler and having high hardness is used as the second resin portion 34a.

As shown in FIG. 8B, the first resin portion 32a is formed if liquid resin is coated and is thermally hardened. It is not necessary to fill the resin under each of the second semiconductor chips 20 on the semiconductor wafer 10, if liquid resin not including the filler is coated on the semiconductor wafer 10. This results in reduction of the manufacturing cost.

Fourth Embodiment

A fourth embodiment is a case where the columnar electrode 40 is composed of a lower electrode and a barrier electrode. FIG. 10A through FIG. 10D illustrate a cross sectional view showing a semiconductor device in accordance with a fourth embodiment. As shown in FIG. 10A, a columnar electrode 40a is composed of a lower electrode 42 made of copper and a barrier electrode 44 including nickel, being different from the process shown in FIG. 3A in the first embodiment. As shown in FIG. 10B, the second semiconductor chip 20 is flip-chip bonded onto the semiconductor wafer 10, as in the case of the process shown in FIG. 3B. As shown in FIG. 10C, the second resin portion 34 is formed, as in the case of the process shown in FIG. 3C. As shown in FIG. 10D, an upper portion of the barrier electrode 44 is grinded and the thickness of the barrier electrode 44 is reduced, when the molding portion 30 and the second semiconductor chip 20 are grinded. The semiconductor device in accordance with the fourth embodiment shown in FIG. 11 is fabricated with the processes shown in FIG. 3D through FIG. 4C in the first embodiment.

In accordance with the fourth embodiment, the columnar electrode 40a consist of the lower electrode 42 and the barrier electrode 44 is formed on the semiconductor 10 with the plating method, as shown in FIG. 10A. As shown in FIG. 10D, the upper portion of the barrier electrode 44 is grinded together with the molding portion 30. This results in that the barrier electrode 44 gets an adequate thickness. The barrier electrode 44 is a barrier against diffusion of Sn (tin) of the solder terminal 48 on the barrier electrode 44 to the lower electrode 42 and against corrosion of metal. It is preferable that the barrier electrode 44 is formed in a case where a component of the solder terminal diffuses into the lower electrode 42 and the metal is corroded, even if the lower electrode 42 is made of other than copper and the barrier electrode 44 is made of other than nickel. It is preferable that the lower electrode 42 is made of a material having small electrical resistivity. And it is preferable that the barrier electrode 44 has a high barrier performance. The thickness of the barrier electrode 44 may be selected suitably in a range where the barrier electrode 44 has a barrier performance.

Palladium and gold acting as the barrier electrode 44 may be nonelectrolytic plated on nickel, after the process shown in FIG. 10D. Nickel, palladium and gold acting as a barrier electrode may be nonelectrolytic plated on the copper, after the process shown in FIG. 3D in the first embodiment. The barrier electrode may be provided in the semiconductor device in accordance with the first embodiment through the third embodiment.

Fifth Embodiment

A fifth embodiment is a case where two of the semiconductor devices 100 in accordance with the first embodiment are stacked. As shown in FIG. 12, the semiconductor device 100 is mounted on the intermediate substrate 50 shown in the first conventional embodiment and the second conventional embodiment through a die attach member 60. In FIG. 12, a pad 49 composed of a lamination of gold and nickel is provided instead of the solder terminal. And another semiconductor device 100 is mounted through an adhesive agent 62. Bonding wires 64 and 66 are electrically coupled between the pad 49 and the intermediate substrate 50. The semiconductor device 100 is sealed with a molding portion 68. In FIG. 12, two of the semiconductor devices 100 are stacked. However, the number of the semiconductor device 100 is not limited. The semiconductor device in accordance with the first embodiment through the fourth embodiment may be stacked. In the fifth embodiment, the semiconductor device 100 is mounted on the intermediate substrate 50 acting as the mount portion. That is, the first semiconductor chip is mounted on the mount portion. However, the mount portion is not limited if the semiconductor device 100 can be mounted on the mount portion.

In the first embodiment through the fourth embodiment, one of the second semiconductor chips 20 is flip-chip bonded onto the first semiconductor chip 11. However, a plurality of the second semiconductor chips 20 may be flip-chip bonded onto the first semiconductor chip 11. In the above-mentioned description, the first resin portion 32 and the second resin portion 34 are composed of the epoxy resin. However, polyimide resin or silicon resin may be used.

In the first embodiment through the fourth embodiment, the molding portion 30 and the second semiconductor chip 20 or the semiconductor wafer 10 is grinded. However, they may be polished.

While the above description constitutes the preferred embodiments of the present invention, it will be appreciated that the invention is susceptible of modification, variation and change without departing from the proper scope and fair meaning of the accompanying claims.

We claim:

1. A method for manufacturing a semiconductor device comprising:
   forming a columnar electrode comprising a barrier electrode portion on a semiconductor wafer wherein the base of the columnar electrode is parallel with the top surface of the columnar electrode over a span that extends from a first to a second sidewall of the columnar electrode;
   flip-chip bonding a second semiconductor chip onto the semiconductor wafer;
   forming a molding portion on the semiconductor wafer, the molding portion covering and molding the columnar electrode and the second semiconductor chip;
   grinding or polishing the molding portion and the second semiconductor chip so that an upper face of the barrier electrode and an upper face of the semiconductor chip are exposed wherein the upper face of the barrier electrode and the upper face of the second semiconductor chip are coplanar; and
   cutting the molding portion and the semiconductor wafer so that a first semiconductor chip is formed where the second semiconductor chip is flip-chip bonded and the columnar electrode is formed.

2. The method as claimed in claim 1, further comprising grinding or polishing a lower face of the semiconductor wafer.

3. The method as claimed in claim 1, wherein the columnar electrode is electrically coupled to the first semiconductor chip and the second semiconductor chip.

4. The method as claimed in claim 1, wherein the step of forming the columnar electrode comprises the step of forming the columnar electrode with an electrolytic plating method.

5. The method as claimed in claim 4, wherein:
   the step of forming the columnar electrode includes the step of forming a lower electrode and a barrier electrode on the semiconductor wafer with the electrolytic plating method; and
   the step of grinding or polishing the molding portion includes the step of grinding or polishing the molding portion together with an upper portion of the barrier electrode.

6. The method as claimed in claim 5, further comprising the step of forming a solder terminal on the barrier electrode.

7. The method as claimed in claim 4, wherein the step of flip-chip bonding the second semiconductor chip is performed after the step of forming the columnar electrode.

8. The method as claimed in claim 1, wherein the step of forming the columnar electrode comprises the step of forming the columnar electrode so as to be lower than the second semiconductor chip that is to be flip-chip bonded onto the semiconductor wafer.

9. The method as claimed in claim 1, wherein the step of forming the molding portion includes the steps of:
   forming a first resin portion so as to cover an area between an upper face of the semiconductor wafer and a lower face of the second semiconductor chip;
   and forming a second resin portion on the first resin portion.

10. The method as claimed in claim 9, wherein the step of forming the first resin portion includes the step of coating a liquid resin on the semiconductor wafer to form the first resin portion.

11. The method as claimed in claim 1, further comprising the step of mounting the first semiconductor chip onto a mount portion.

* * * * *